(12) United States Patent
Niratsuka

(10) Patent No.: US 6,597,162 B2
(45) Date of Patent: Jul. 22, 2003

(54) PLL SEMICONDUCTOR DEVICE WITH TESTABILITY, AND METHOD AND APPARATUS FOR TESTING SAME

(75) Inventor: Kimitoshi Niratsuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/757,492

(22) Filed: Jan. 11, 2001

(65) Prior Publication Data

US 2001/0028243 A1 Oct. 11, 2001

(30) Foreign Application Priority Data

Apr. 10, 2000 (JP) ........................................ 2000-113200

(51) Int. Cl.[7] .............................................. G01R 23/12
(52) U.S. Cl. ................................................... 324/76.53
(58) Field of Search ...................... 331/17, 10; 324/765, 324/76.53

(56) References Cited

U.S. PATENT DOCUMENTS

| | | | |
|---|---|---|---|
| 5,359,727 A | * 10/1994 | Kurita | 331/10 |
| 5,973,571 A | * 10/1999 | Suzuki | 331/17 |
| 6,037,814 A | 3/2000 | Hirakawa | 327/156 |

FOREIGN PATENT DOCUMENTS

| | | | |
|---|---|---|---|
| JP | A-64-49424 | | 2/1989 |
| JP | 64-49424 | | 2/1989 |
| JP | 08-316833 | * | 11/1996 |
| JP | 09-181133 | * | 7/1997 |

* cited by examiner

*Primary Examiner*—Christine Oda
(74) *Attorney, Agent, or Firm*—Arent Fox Kintner Plotkin & Kahn

(57) ABSTRACT

On a semiconductor device 20, fabricated are a VCO 10A, an frequency divider by integer R 21, a frequency divider by integer (P×N+A) 22 wherein each of P, N and A is an integer, A is variable and A<N, a phase comparator 23, and a charge pump 24. A low pass filter 25 having been confirmed to have standard characteristics is externally added to the semiconductor device 20 to construct a PLL circuit to be tested. The frequency divider 22 is of a pulse swallow type and has a control input for setting the integer A at ones in the vicinity of a value in normal use by user. The control input is connected to external terminals D0 and D1 of the semiconductor device 20 for simplifying a test. The semiconductor device 20 is judged whether it is acceptable or not in quality by checking whether or not the PLL circuit enters into a locked state within a given period in each cases of A=A1 and A=A2, where A1<A0<A2 and A0 is a value in normal use by user.

8 Claims, 11 Drawing Sheets

PASS/FAIL

PLL SEMICONDUCTOR DEVICE WITH TESTABILITY, AND METHOD AND APPARATUS FOR TESTING SAME

BACKGROUND OF THE INVENTION

1. Field of the Invention

The present invention relates to a semiconductor device on which at least a VCO and a frequency divider for constructing a PLL (phase-locked loop) circuit are fabricated, in which the frequency divider has a control input for simplifying a test, and a method and apparatus for testing the same.

2. Description of the Related Art

FIG. 11(A) is a schematic block diagram of a prior art testing apparatus for a voltage controlled oscillator (VCO) 10. FIG. 11(B) shows a relationship between the control voltage VC and the output frequency of the VCO 10.

The VCO 10 is plugged into a socket of a test board, the control voltage VC is applied to the VCO 10 from a tester 12 and the outgoing clock signal OUT of the VCO 10 is provided to the tester 12. The tester 12 checks on whether or not the frequency of the outgoing clock signal OUT falls within a tolerance when the control voltage VC is each of V1, V2 and V3, and if the frequency of the outgoing clock signal OUT falls within the tolerance for each control voltage VC, the VCO 10 is judged to be acceptable in quality (pass)

However, even if the VCO 10 is judged to be acceptable in quality, when the VCO 10 is employed in a PLL circuit, it has to be checked whether or not the PLL circuit can enter into a locked state in a given time for a reference clock signal, which causes a test cost to be high. Especially, when the VCO 10 is fabricated on one chip together with a frequency divider and others, it has been required to reduce a device test time to save the cost.

SUMMARY OF THE INVENTION

Accordingly, it is an object of the present invention to provide a PLL semiconductor device, including at least a VCO and a frequency divider, capable of reducing its test time by performing a test on the PLL semiconductor device in a simpler manner, and a method and apparatus for testing the PLL semiconductor device.

In one aspect of the present invention, to test a semiconductor device, comprising the steps of: preparing a PLL circuit whose VCO and programmable frequency divider by integer M are built in the semiconductor device, the frequency divider dividing a frequency of an incoming clock signal or an outgoing clock signal from the VCO; setting the integer M to a first value larger and a second value smaller than a value in normal use by user; checking whether or not the PLL circuit enters into a locked state within a given time period in each case of the integer M being set to the first and second values; and judging whether or not the semiconductor device is acceptable in quality based on the result of the checking.

With this aspect of the present invention, since operation check is performed not only on VCO but also on the PLL circuit as a whole, the test is simpler than the prior art in which operation tests on VCO and the PLL circuit are performed independently, and a test time is reduced, thereby enabling decrease in test cost.

Other aspects, objects, and the advantages of the present invention will become apparent from the following detailed description taken in connection with the accompanying drawings.

DESCRIPTION OF THE PREFERRED EMBODIMENTS

Figure 1:
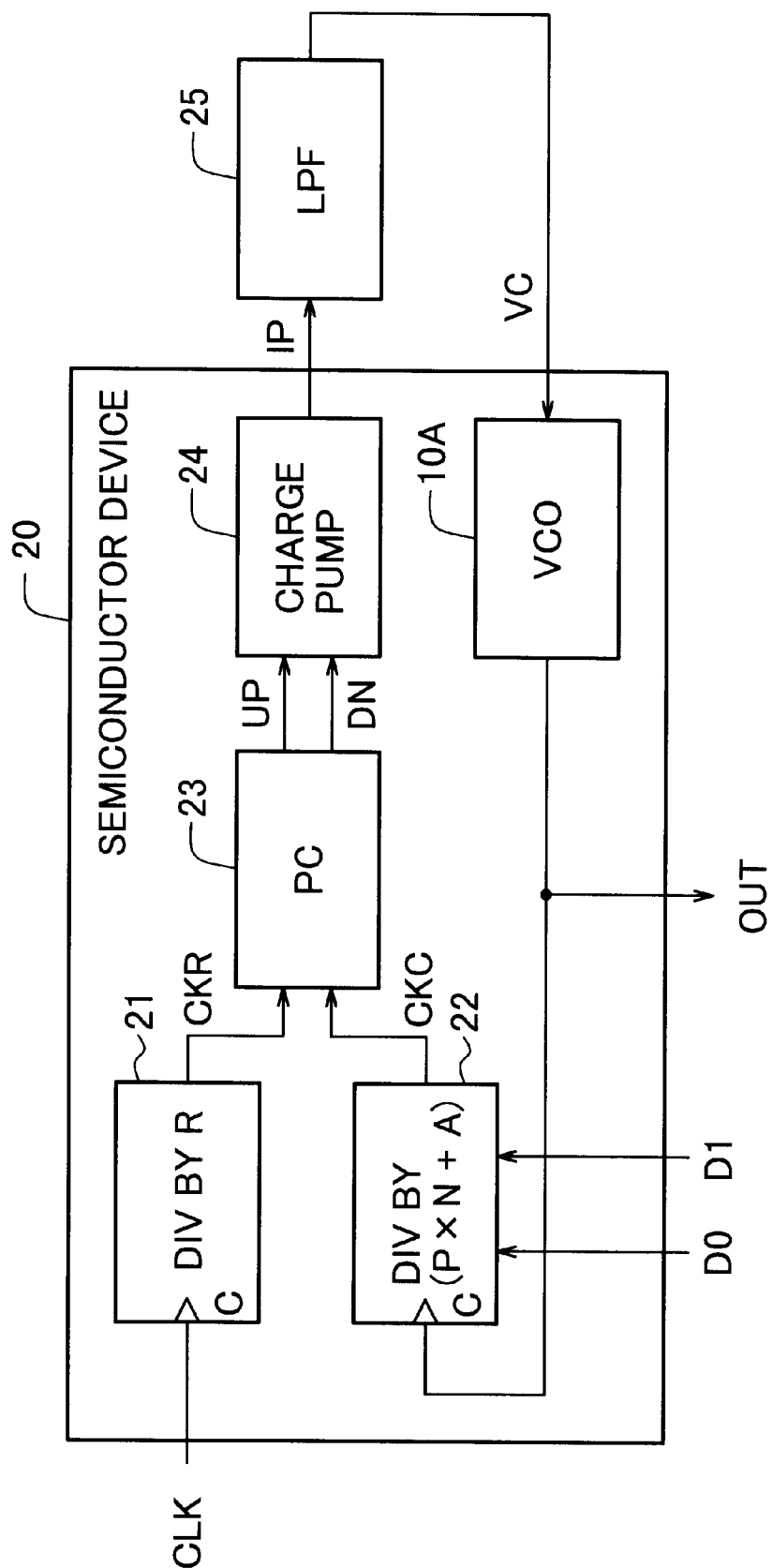
FIG. 1 is a schematic block diagram of a PLL circuit of a first embodiment according to the present invention.

Referring now to the drawings, wherein like reference characters designate like or corresponding parts throughout several views, preferred embodiments of the present invention are described below.

FIG. 1 is a schematic block diagram of a PLL circuit of a first embodiment according to the present invention.

On a PLL semiconductor device 20, fabricated are not only a VCO 10A, but also a frequency divider by integer R 21A, a frequency divider by integer (P×N+A) 22 in which a value of A is variable, a phase comparator 23 and a charge pump 24, and a low pass filter (loop filter) 25 is added externally to complete the PLL circuit.

The reason why the low pass filter 25 is not fabricated on the PLL semiconductor device 20 is that since the low pass filter 25 has a comparatively large capacitor, the chip area of the PLL semiconductor device 20 increases when the low pass filter is fabricated on the PLL semiconductor device 20, resulting in higher product cost.

An incoming clock signal CLK having a nominal frequency and the outgoing clock signal OUT of the VCO 10A are provided to the clock inputs C of the frequency divider by integer R 21A and the frequency divider by integer (P×N+A) 22, respectively. A reference clock signal CKR and a compared clock signal CKC obtained by frequency division in the frequency dividers 21 and 22, respectively, are provided to the phase comparator 23 to compare their phases with each other. The phase comparator 23 asserts an up signal UP or a down signal DN according to detected phase relation between the clock signals CKR and CKC, and provides it to the charge pump 24 for increasing or decreasing the frequency of the compared clock signal CKC so as to reduce a phase error. The charge pump 24 has an output to charge or discharge the filter capacitor in the low pass filter 25 in response to the activated UP or DN signal, respectively. The low pass filter 25 provides the voltage VC of the filter capacitor, which is provided to the control input of the VCO 10A.

The frequency divider by integer (P×N+A) 22 is of a pulse swallow type, and its control input for setting a variable integer A in the vicinity of a value in normal use by user is connected to external terminals Do and D1 of the PLL semiconductor device 20 for the purpose of simplification of a test. When a value of integer P or N varies by one, an integer P×N varies by N or P. In order to make the integer P×N large with a simple configuration, P or N is required to be not a small value. While, when a value of A varies by one, the integer (P×N+A) varies by one. Therefore, the integer (P×N+A) can be easily adjusted to a proper value in normal use by user without a small value P or N. That is, fine adjustment is possible with a simpler configuration of the divider.

Figure 2:
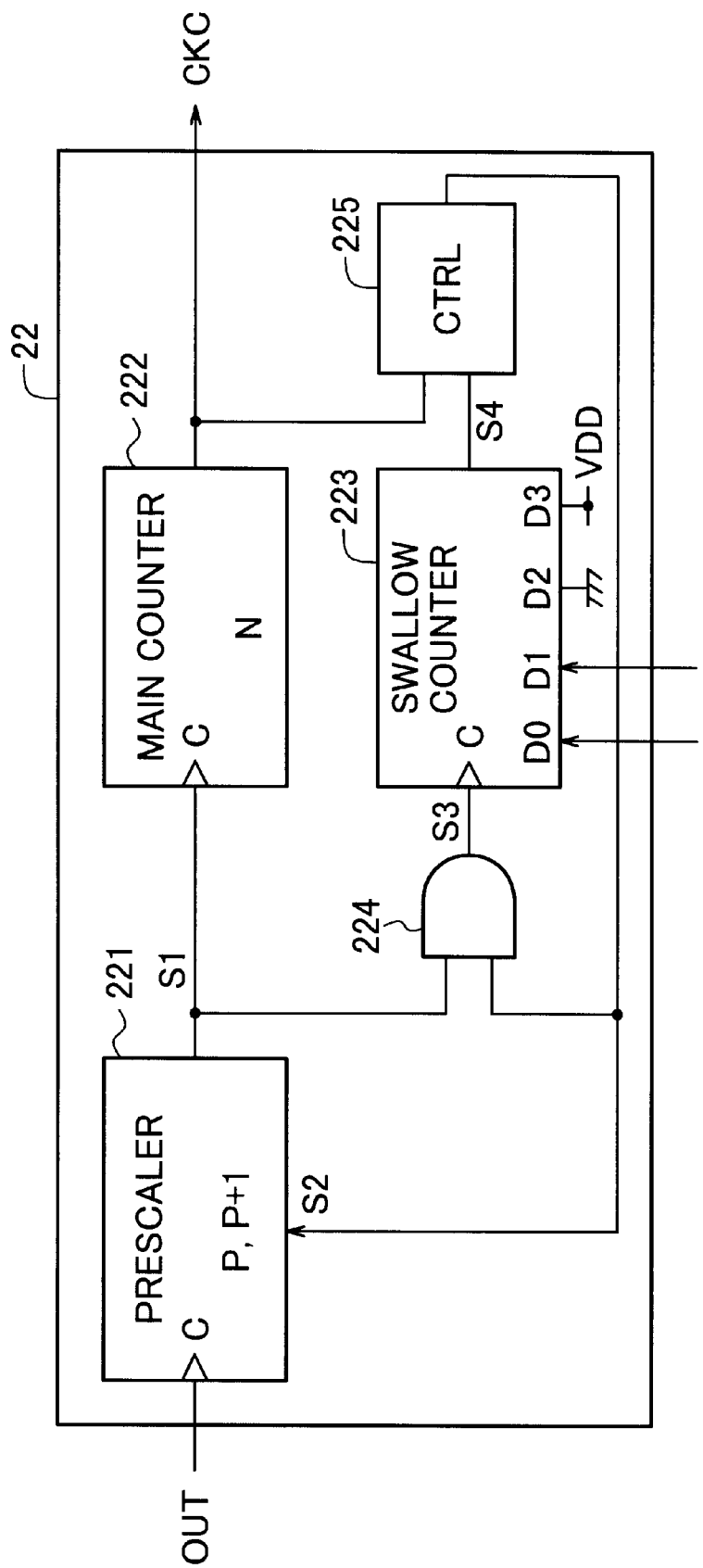
FIG. 2 is a circuit diagram showing an embodiment of the frequency divider by integer (P×N+A) of FIG. 1.

FIG. 2 shows an embodiment of a frequency divider by integer (P×N+A) 22.

A prescaler 221 works as a frequency divider by integer P when a control signal S2 provided to its control input is low, while working as a frequency divider by integer (P+1) when the control signal S2 is high. The prescaler 221 receives a clock signal OUT at its clock input C and divides the frequency thereof to generate a signal S1 and provide the signal S1 to the clock input C of a main counter 222. The main counter 222 divides the frequency of the signal S1 by the integer N to generate the compared clock signal CKC.

The programmable frequency divider 22 works as a frequency divider by integer P×N when the control signal S2 is fixed low, while working as a frequency divider by integer (P+1)×N when the control signal S2 is fixed high. In order to enable setting of the dividing factor of the programmable frequency divider 22 to an intermediate value between both the dividing factors P×N and (P+1)×N, a swallow counter 223, an AND gate 224 and a control circuit 222 are provided to the divider 22.

Figure 4:
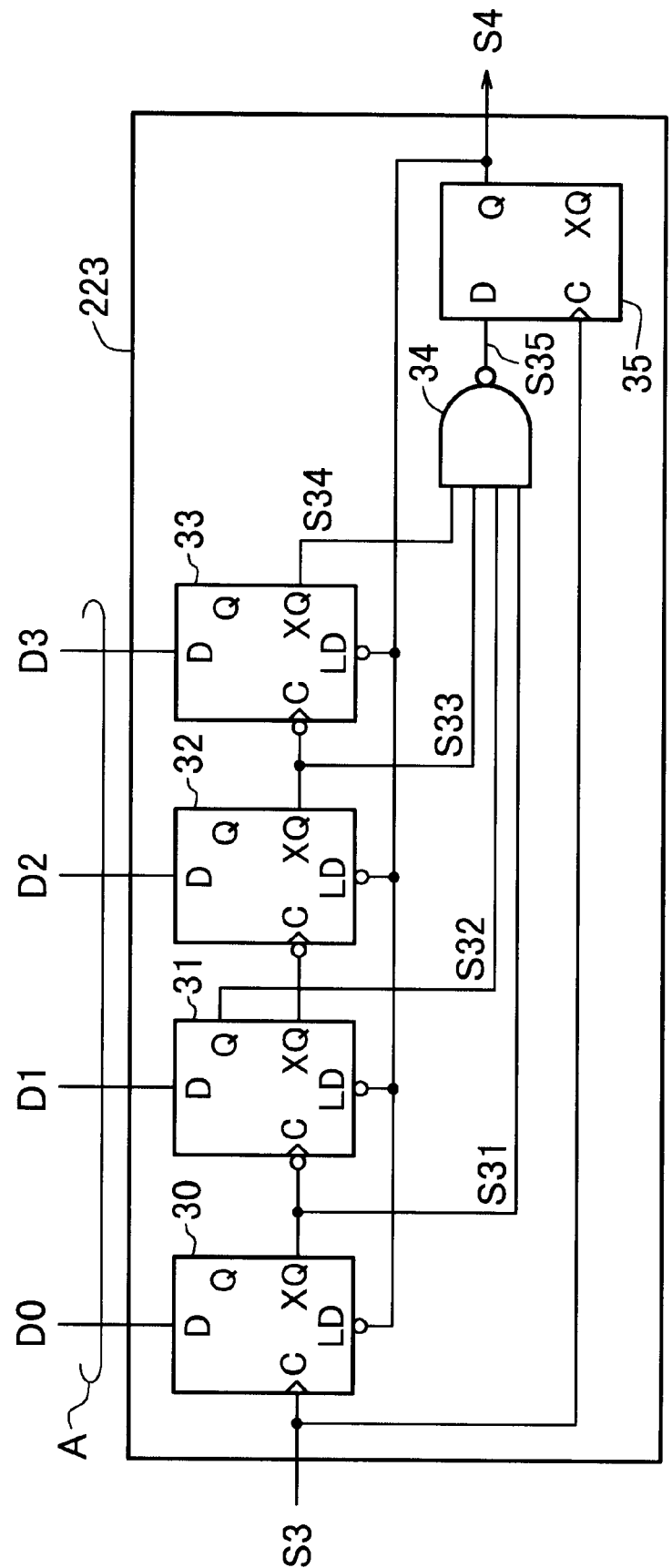
FIG. 4 is a logic circuit diagram showing an embodiment of the swallow counter of FIG. 2.

FIG. 4 is a logic circuit diagram showing an embodiment of the swallow counter 223.

T flip-flops 30 to 33 are connected in cascade so as to work as a down counter. Outgoing signals S31 to S34 from the T flip-flops 30 to 33 are provided to a NAND gate 34 such that the output of the NAND gate 34 is low when the count is 2. An incoming signal S3 is provided to the clock inputs C of the T flip-flop 30 and a D flip-flop 35. An output Q of the flip-flop 35, which is also the output signal S4 of the swallow counter 223, is provided to load inputs LD of the T flip-flops 30 to 33. Bits D0 to D3 are loaded on the respective T flip-flops 30 to 33 when the load control inputs LD of the T flip-flops 30 to 33 are low.

Figure 5:
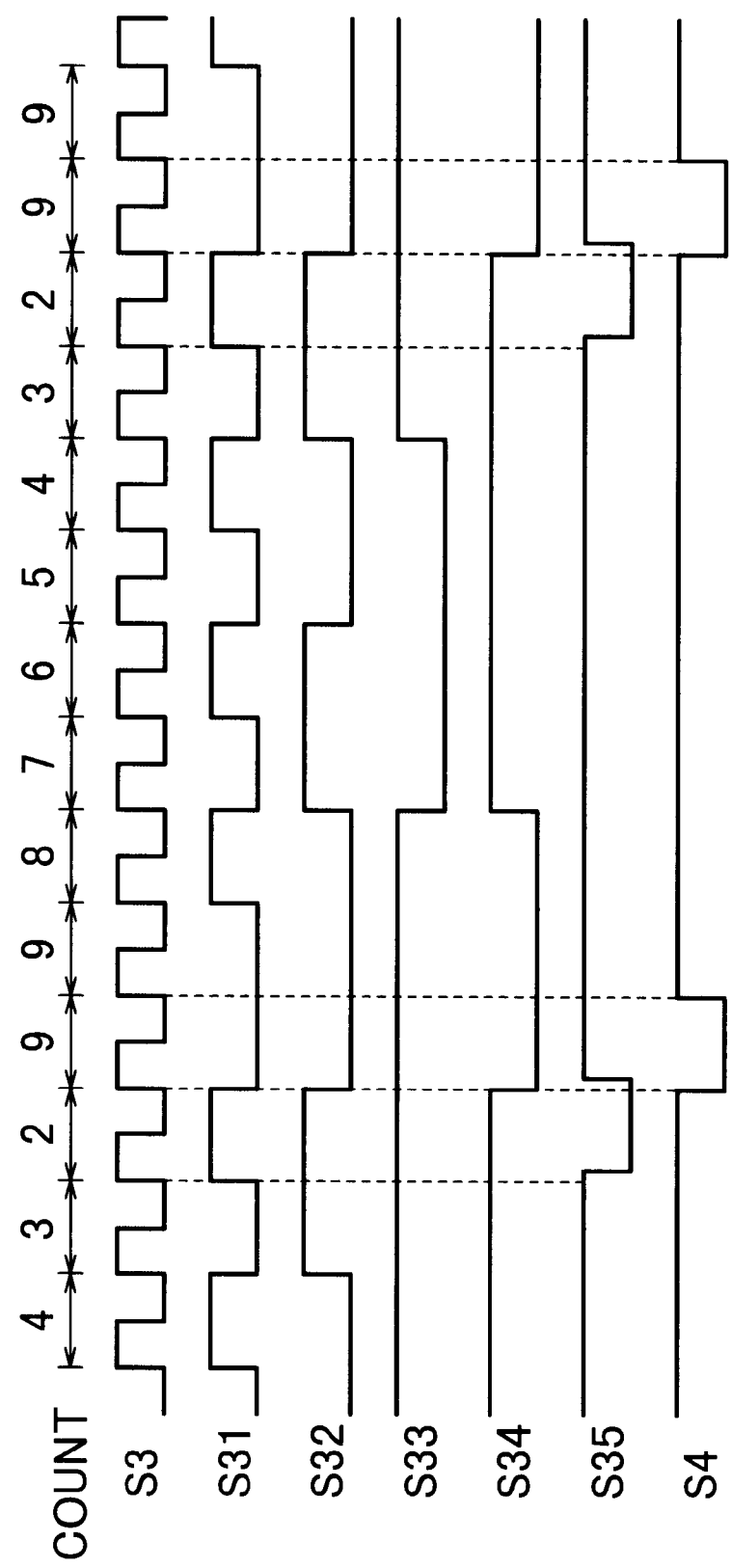
FIG. 5 is a timing chart showing operation of the circuit of FIG. 4.

FIG. 5 is a timing chart showing operation of the circuit of FIG. 4.

When the count indicates 2, the output signal S35 of the NAND gate 35 is low, and the signal S4 goes low at the rise of the next pulse of the signal S3, the count of the swallow counter 223 is set to A=D3D2D1D0 and thereby, the signal S35 goes high, which state is latched to the D flip-flop 35 on the rise of the still next pulse of the signal S3 and the signal S4 goes high. Thereafter, down counting is performed on each rise of a pulse of the signal S3. When the count indicates 2, such an operation is repeated.

Referring back to FIG. 2, the signals S1 and S2 are provided to the AND gate 224 and the output signal S3 thereof is provided to the clock input C of the swallow counter 223. The output signal S4 of the swallow counter 223 and the output clock signal CKC of the main counter 222 are provided to a control circuit 225 and the control signal S2 is outputted therefrom.

Figure 3:
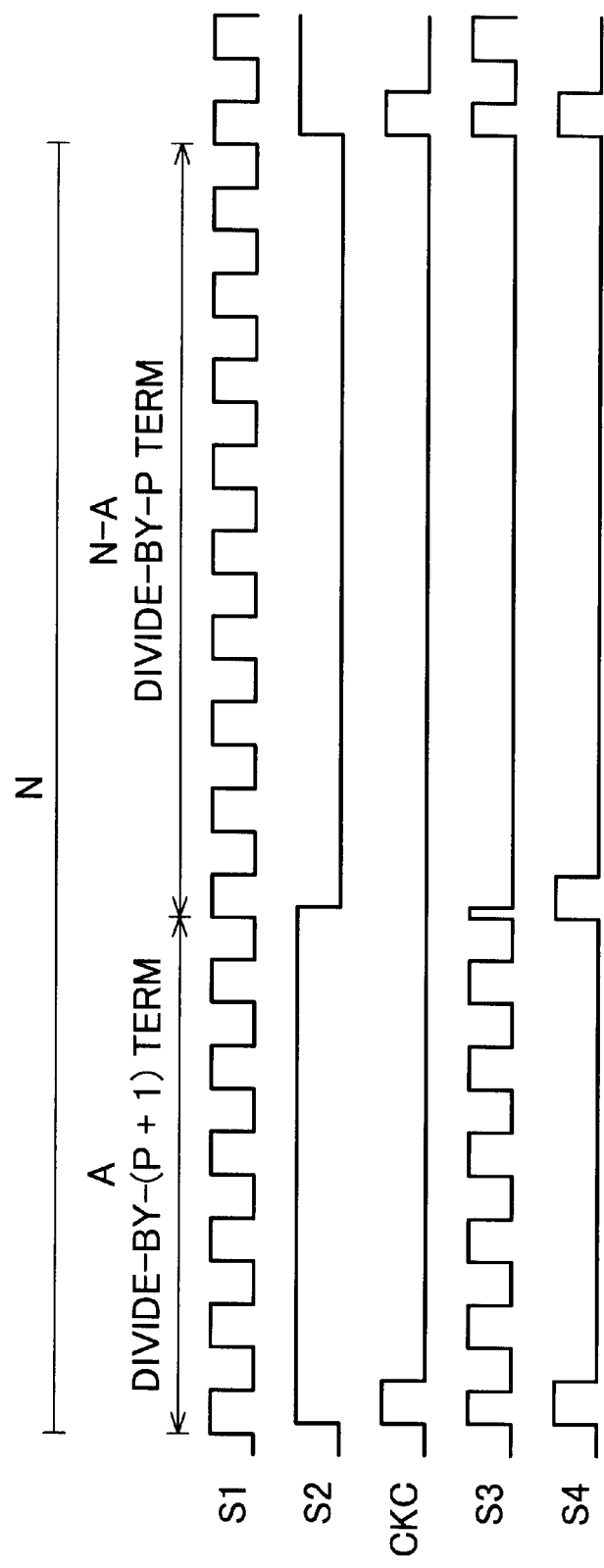
FIG. 3 is a timing chart showing operation of the circuit of FIG. 2.

FIG. 3 is a timing chart showing operation of the circuit of FIG. 2.

When the signal S4 is high, the control signal S2 is high. During the control signal S2 is high, the prescaler 221 works as divide-by-(P+1), and the signal S1 passes through the AND gate 224 as the signal S3. On one hand, the count of the swallow counter 223 is decremented in response to the rise of the signal S3, on the other hand, the count of the main counter 222 is decremented in response to the rise of the signal S1. Since A<N, the divide-by-A swallow counter 223 counts down to the minimum value earlier than the main counter 222. When the count of the swallow counter 223 indicates 2, the signal S4 goes low at the rise of the next pulse of the signal S3. Thereafter, the control signal S2 goes low, and the AND gate 224 is closed and the prescaler 221 becomes divide-by-P. The time period over which the signal S2 is high is of A times the cycle time of the signal S1. Thereafter, when the count of the main counter 22 has reached a value 1 by pulses of the signal S1, the value N is loaded on the main counter 222 at the rise of the next pulse of the signal S1, and the clock signal CKC also goes high. Thereby, the control signal S2 goes high and not only is the AND gate 224 opened, but the prescaler also works as divide-by-(P+1). The time period over which the signal S2 is low is of (N−A) times the cycle time of the signal S1. Next, the clock signal CKC goes low and the signal S4 goes high.

With such an operation, the number of pulses of the clock signals OUT included in one cycle time of the clock signal CKC, namely the dividing factor of the frequency divider 22 is (P+1)A+P(N−A)=P×N+A.

Figure 6:
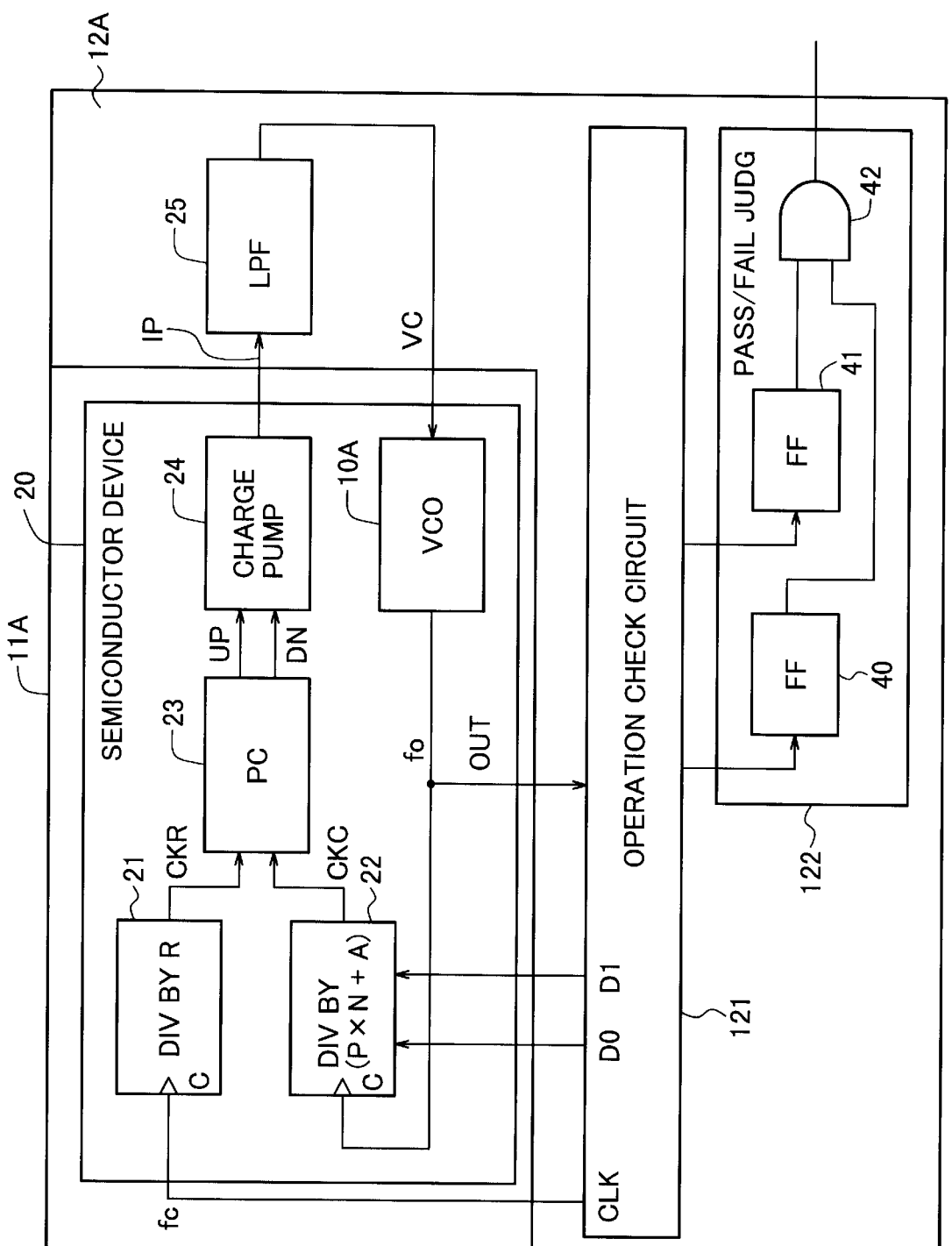
FIG. 6 is a schematic block diagram of a testing apparatus to judge acceptable/unacceptable in quality of a PLL semiconductor device.

FIG. 6 is a schematic block diagram of a testing apparatus to judge acceptable/unacceptable in quality of the PLL semiconductor device 20 configured as described above.

A tester 12A comprises a low pass filter 25 which was confirmed to have standard characteristics, an operation check circuit 121 for the PLL semiconductor device 20, and an acceptable/unacceptable (pass/fail) judgment circuit 122 receiving check results from the circuit 121. The circuit 122 comprises flip-flops 40 and 41 for holding operation results of first and second times, and an AND gate 42 receiving the outputs of the flip-flops 40 and 41.

The tester 12A is connected to a socket on a test board 11A and when the PLL semiconductor device 20 is automatically plugged into the socket, the circuit of FIG. 6 is completed. That is, the PLL circuit is constructed of the PLL semiconductor device 20 and the low pass filter 25, and the control input bits D0 and D1 of the frequency divider by integer (P×N+A) 22 can be set by the operation check circuit 121, the clock signal CLK can be provided to the clock input C of the frequency divider by integer R 21 from the circuit 121, and the outgoing clock signal OUT of the VCO 10A is provided to the circuit 121.

In a locked state, the following relation holds between the frequency fo of the clock signal CLK and the frequency fc of the clock signal OUT:

$$fo=(P\times N+A)fc/R \quad (1)$$

Assume that A=A0 in normal use of the PLL semiconductor device 20 by a user, A=A1 and A=A2 in operation check prior to shipment of the device 20, and the relation of A1<A0<A2 holds.

Figure 7:
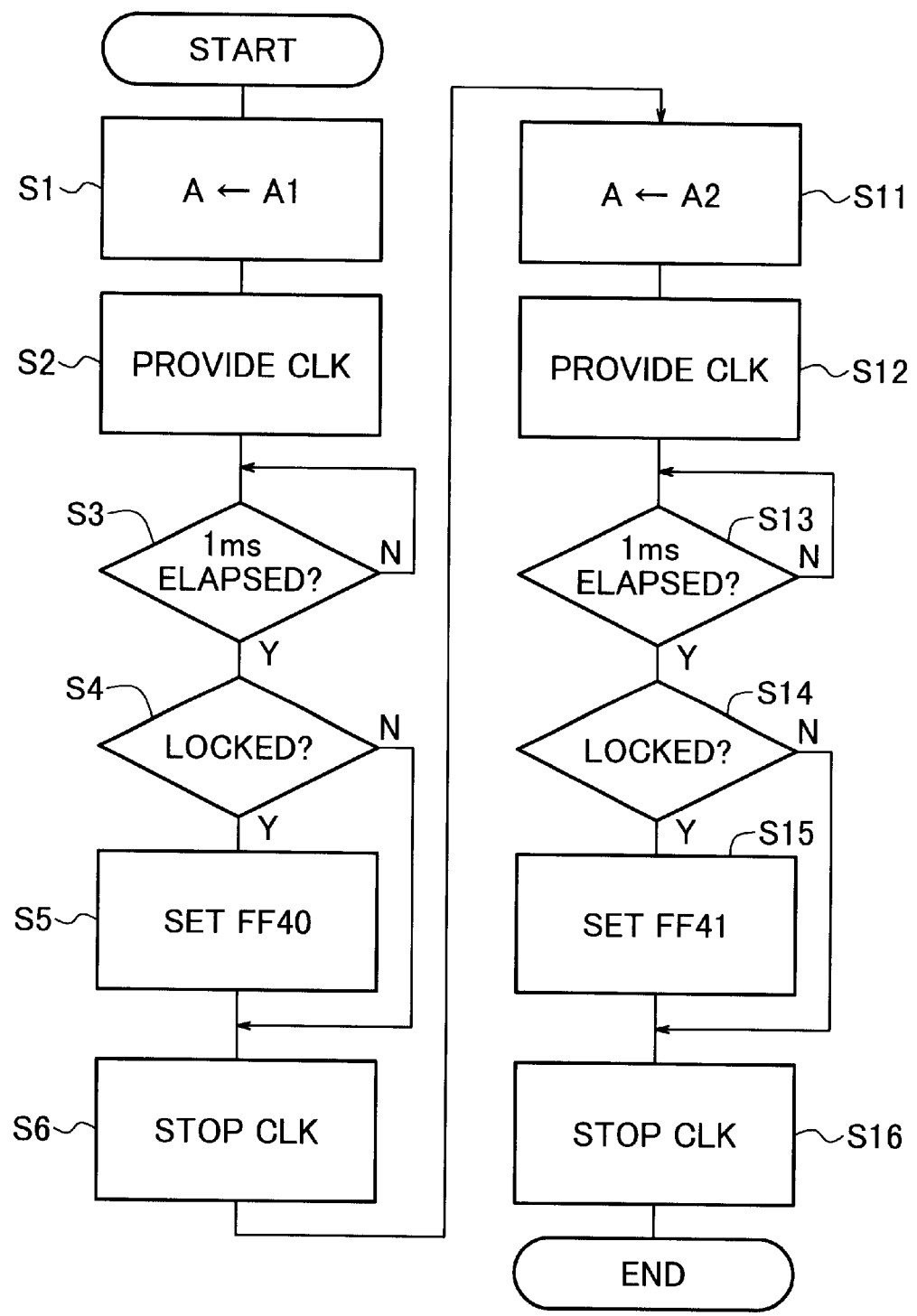
FIG. 7 is a flow chart showing operation of the operation check circuit of FIG. 6.

FIG. 7 is a flow chart showing operation of the operation check circuit 121.

In an initial state, the flip-flops 40 and 41 are reset (S1) The A of the frequency divider by integer (P×N+A) 22 is set to A1 by setting the value of the bits D1 and D0.

(S2) A PLL semiconductor devices 20 is mounted on the test board 11A and then, the operation check circuit 121 outputs the clock signal CLK having a standard frequency fc (accurate value of the nominal frequency).

(S3) The circuit 121 awaits until a given time, e.g., 1 ms elapses.

(S4) It is judged whether or not the PLL circuit is in a locked state based on whether or not the frequency fo of the clock signal OUT is a value given by the above formula (1).

(S5) If the PLL circuit is in a locked state, the flip-flop 40 is set.

(S6) The clock signal CKL is stopped.

Then, a processing of steps S11 to S16 similar to the processing of S1 to S6 is performed with A=A2, and if a locked state has been confirmed, the flip-flop 41 is set.

When the PLL semiconductor device 20 is acceptable in quality, the output of the AND gate 42 will go high and when unacceptable in quality, the output thereof will go low.

Assume that when A is equal to A0, A1 or A2, the control input voltage VC of the VCO 10A is equal to VC0, VC1 or VC2, respectively.

Figure 8:
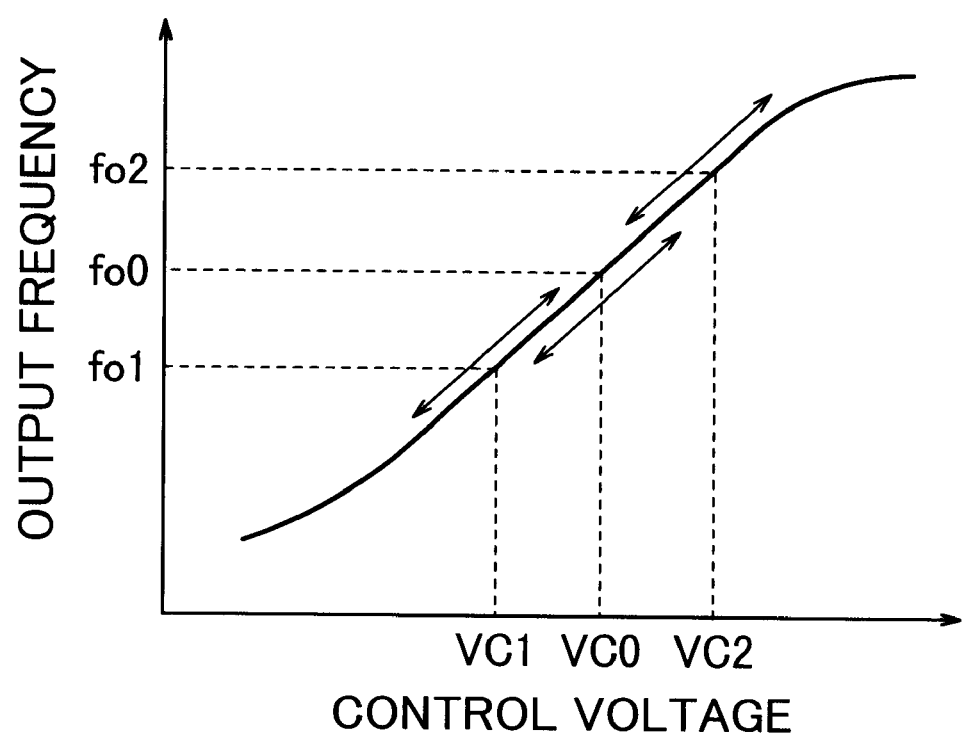
FIG. 8 is a graph showing a relationship between the control voltage VC and the output frequency fo of a VCO in a locked state in a case where a PLL semiconductor device including the VCO is acceptable in quality.

When the PLL semiconductor device 20 is acceptable in quality, in a locked state, a relationship as shown in FIG. 8 for example holds between the control voltage VC and the frequency fo. In FIG. 8, fo0, fo1 and fo2 are frequencies when A is A0, A1 and A2, respectively.

When A=A0 in a locked state, as the value of A increases, the frequency of the compared clock signal CKC goes lower and therefore the control voltage VC is raised by pulses of the up signal UP in order to raise the frequency of the compared clock signal CKC up to the frequency of the reference clock signal CKR. When A=A0 in a locked state, as the value of A decreases, the frequency of the compared clock signal CKC goes higher and therefore the control voltage VC is lowered by pulses of the down signal DN in order to lower the frequency of the compared clock signal CKC down to the frequency of the reference clock signal CKR.

Accordingly, the relation VC1<VC2 holds corresponding to the relation A1<A2.

Figure 9A:
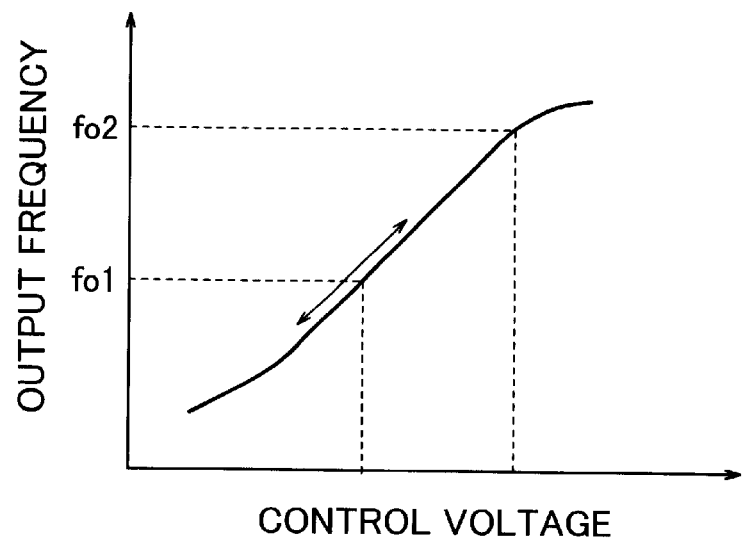
FIG. 9(A) and FIG. 9(B) are graphs corresponding to FIG. 8 in cases where the PLL semiconductor devices are unacceptable in quality.
Figure 9B:
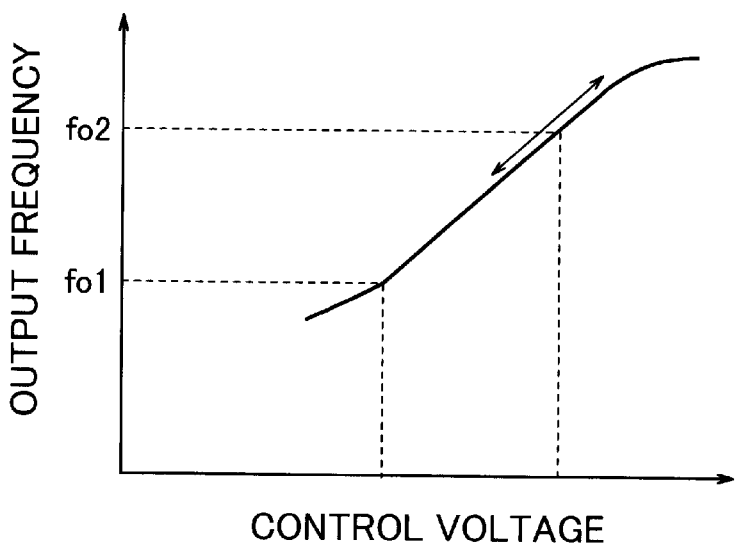

FIG. 9(A) shows a relationship between the control voltage VC and the frequency fo when the PLL semiconductor device 20 is judged to be unacceptable in quality since the device 20 can not enter a locked state within a given period in the condition of A=A2. FIG. 9(B) shows a relationship between the control voltage VC and the frequency fo when the PLL semiconductor device 20 is judged to be unacceptable in quality since the device 20 can not enter a locked state within a given period in the condition of A=A1.

Concrete examples of the dividing factors and the frequencies are as follows:

in the normal use;

$P=8, N=41, R=42, A0=9='1001,' fc=16.8$ MHz, $fo=134.8$ MHz, in the test;
in a locked state with A1=8='1001,' fo1=134.4 MHz= (fo−0.4) MHz, and
in a locked state with A1=10='1010,'

$fo2=135.2$ MHz=$(fo+0.4)$ MHz.

In the above case, only the external terminal of D0 is enough for setting the value of A.

The PLL semiconductor device 20 which has been judged to be acceptable in quality will be mounted on a board on which the device 20 is employed and thereby the values of the bits D0 and D1 are fixed so that the value of A is set to A0. The external terminals D0 and D1 of the PLL semiconductor device 20 for setting A to A1 and A2 are for the operation test of the PLL semiconductor device 20.

According to the first embodiment described above, in the test prior to shipment of a PLL semiconductor device, the value of A can be altered through setting external terminal voltage to values in the vicinity of a value in normal use by user, and by checking whether or not the outgoing clock signal OUT is in a locked state for the vicinity values, operation checks are performed not only on the VCO 10A, but also on the PLL semiconductor device 20 as a whole. Therefore the operation test for the PLL semiconductor device 20 can be simpler than that in the prior art, with the result that the test time can be shorter and the test cost can be reduced.

Second Embodiment

Figure 10:
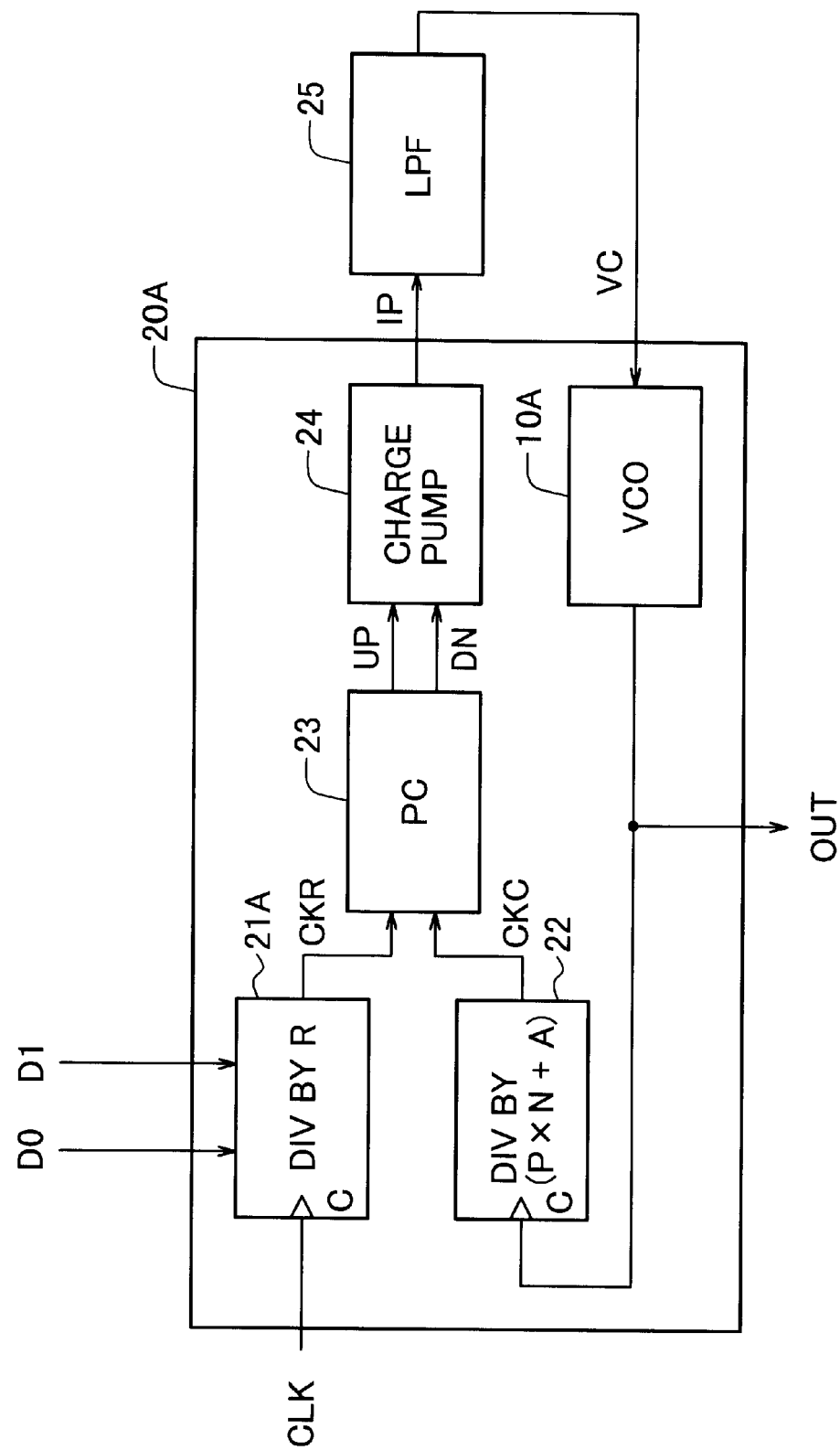
FIG. 10 is a schematic block diagram of a PLL circuit of a second embodiment according to the present invention.
Figure 11A:
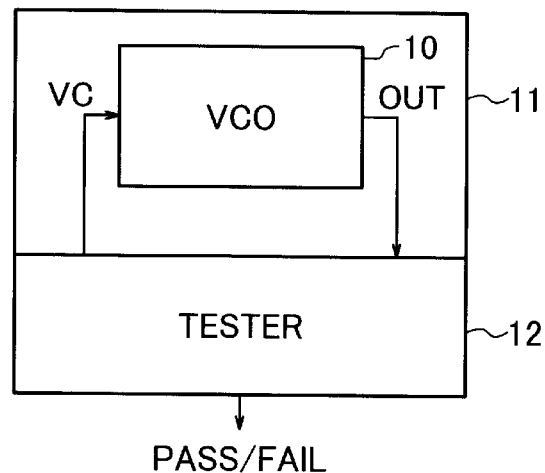
FIG. 11(A) is a schematic block diagram of a prior art testing apparatus for a VCO.
Figure 11B:
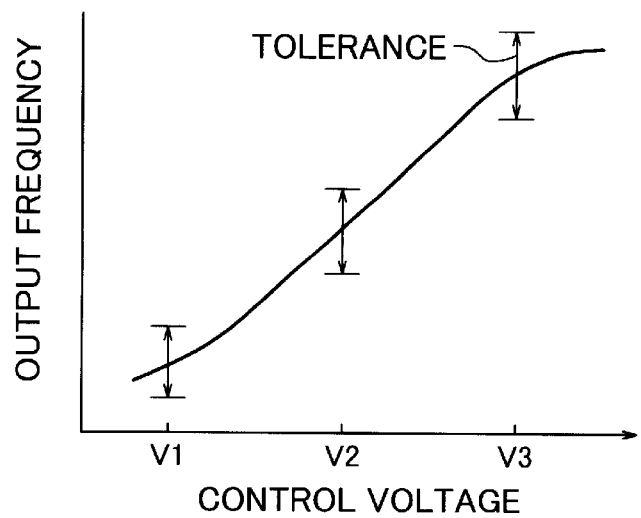
FIG. 11(B) is a graph showing a relationship between a control voltage VC and an output frequency fo of a VCO for explaining a prior art test.

FIG. 10 is a schematic block diagram of a PLL circuit of a second embodiment according to the present invention.

In a PLL semiconductor device 20A, the dividing factor (P×N+A) of a frequency divider by integer (P×N+A) 22A is fixed. In contrast to this, the variable dividing factor R of the frequency divider by integer R 20A can be set, through external terminals D0 and D1 of the PLL semiconductor device 20A in a test prior to shipment of a semiconductor device, to a value in the vicinity of a value in normal use by user.

The frequency divider by integer R 21A may be of either a pulse swallow type or a configuration in which an output bit position of a counter is selected by a selector and thereby the number n of the dividing factor $2^n$ is altered. In this case, the bits D0 and D1 are select control signal for the selector.

A test similar to the above-described one is applied to the PLL semiconductor device 20A. In this test, it differs from the first embodiment that, as the dividing factor R of the frequency divider by integer R 21A is larger, the value of the control voltage VC in a locked state decreases.

Although preferred embodiments of the present invention has been described, it is to be understood that the invention is not limited thereto and that various changes and modifications may be made without departing from the spirit and scope of the invention.

For example, the present invention may be of a configuration in which the low pass filter 25 is built in the PLL semiconductor device 20 or 20A.

Further, in the present invention, the dividing factor of a programmable frequency divider has only to be set through the external terminals of the PLL semiconductor device to a value in the vicinity of a value in normal use by user, and the dividing factor in normal use may be variable.

The frequency divider by integer (P×N+A) may be of a prior art configuration and in the swallow counter 223 of FIG. 4, for example, the output Q of the flip-flops 30 and the output XQ of the flip-flops 31 may be employed as signals S31 and S32, respectively, and the control circuit 225 of FIG. 2 may be an OR gate.

What is claimed is:

1. A method of testing a semiconductor device, comprising the steps of:
    preparing a PLL circuit whose VCO and programmable frequency divider by integer M are built in said semiconductor device, said programmable frequency divider dividing a frequency of an incoming clock signal or an outgoing clock signal from said VCO, said integer M being a value indicating a dividing factor of said programmable frequency divider;

setting said integer M to a first value larger and a second value smaller than a value in normal use by user;

checking whether or not said PLL circuit enters into a locked state within a given time period in each case of said integer M being set to said first and second values; and judging whether or not said semiconductor device is acceptable in quality based on the result of said checking.

2. The method of claim 1, wherein said PLL circuit further comprises:

a phase comparator, built in said semiconductor device, receiving a reference clock signal and a clock signal whose frequency is proportional to the output frequency of said VCO, to compare phases thereof, providing up and down signals, asserting said up and down signals in response to phase relation therebetween; and an external circuit connected to said semiconductor device so as to constitute said PLL circuit, said external circuit having been confirmed to be acceptable in quality, wherein in the step of said judging, it is judged that said semiconductor device is unacceptable in quality when said PLL circuit does not enter into a locked state within said given time period in a case of said integer M being set to said first or second value.

3. A testing apparatus for a semiconductor device comprising constituents of a PLL circuit, said constituents including a VCO and a programmable frequency divider by integer M, said programmable frequency divider dividing a frequency of an incoming clock signal or an outgoing clock signal from said VCO, said integer M being a value indicating a dividing factor of said programmable frequency divider, said testing apparatus comprising:

an external circuit to be connected to said semiconductor device so as to constitute said PLL circuit, said external circuit having been confirmed to be acceptable in quality;

an operation check circuit, setting said integer M to a first value larger and a second value smaller than a value in normal use by user, checking whether or not said PLL circuit enters into a locked state within a given time period in each case of said integer M being set to said first and second values; and a judgment circuit, judging whether or not said semiconductor device is acceptable in quality based on the result of said checking.

4. A semiconductor device comprising constituents of a PLL circuit, said constituents including:

a VCO; and a programmable frequency divider by integer M, receiving an outgoing clock signal from said VCO to generate a divide-by-M clock signal, said integer M being a value indicating a dividing factor of said programmable frequency divider;

wherein said programmable frequency divider by integer M has an external terminal receiving a signal in a test to determine said integer M at one in the vicinity of a value in normal use by user.

5. The semiconductor device of claim 4, wherein said external terminal is for determining the integer M in said test at ones larger and smaller than said value in normal use by user.

6. The semiconductor device of claim 5, wherein said frequency divider by integer M comprises a swallow counter so that said integer M is expressed as (P×N+A), wherein each of P, N and A is an integer and A<N, wherein said external terminal is for determining said integer A.

7. The semiconductor device of claim 5, wherein said programmable frequency divider by integer M comprising:

a prescaler, dividing a frequency of said outgoing clock signal from said VCO by integer P or (P+1) to provide a first divided clock signal, having a control input receiving a control signal to select said integer P or (P+1);

a main counter, receiving said first divided clock signal to divide by integer N in order to generate said divide-by-M clock signal;

a logic gate, receiving said first divided clock and said control signal, providing said first divided clock signal as a second divided clock signal when said control signal indicates to select said integer (P+1);

a swallow counter, receiving said second divided clock signal to divide by integer A in order to generate a third divided clock signal, the integer A being smaller than the integer N; and a control circuit, generating said control signal based on said divide-by-M clock signal and said third divided clock signal so that a relation M=(P×N+A) holds, wherein said external terminal receives a signal to determine a value of said A.

8. The semiconductor device of claim 7, wherein said constituents further including:

a phase comparator, receiving said divide-by-M clock signal and a reference clock signal to compare phases thereof, providing up and down signals, asserting said up and down signals in response to phase relation therebetween; and a charge pump, receiving said up and down signals, having an output to charge and discharge in response to said up and down signals in order to raise and lower, respectively, the output frequency of said VCO.

* * * * *